(12) United States Patent
Bowen

(10) Patent No.: US 7,372,129 B2
(45) Date of Patent: May 13, 2008

(54) TWO DIE SEMICONDUCTOR ASSEMBLY AND SYSTEM INCLUDING SAME

(75) Inventor: Neal Bowen, Kuna, ID (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 11/110,583

(22) Filed: Apr. 20, 2005

(65) Prior Publication Data

US 2005/0184367 A1 Aug. 25, 2005

Related U.S. Application Data

(62) Division of application No. 10/652,163, filed on Aug. 29, 2003.

(51) Int. Cl.
H01L 23/495 (2006.01)

(52) U.S. Cl. .................. 257/666; 257/686; 257/E23.04

(58) Field of Classification Search ................ 438/106, 438/107, 108, 111, 112; 257/666, 678, 686, 257/692, 777, 787, E25.006, E25.013, E25.021, 257/E25.027, E23.085, E33.066, E23.031, 257/E23.04
See application file for complete search history.

(56) References Cited

U.S. PATENT DOCUMENTS

| | | | |
|---|---|---|---|
| 5,157,480 A * | 10/1992 | McShane et al. ........... 257/693 |
| 5,366,933 A | 11/1994 | Golwalkar et al. |
| 5,422,435 A | 6/1995 | Takiar et al. |
| 5,502,289 A | 3/1996 | Takiar et al. |
| 5,677,569 A | 10/1997 | Choi et al. |
| 5,777,345 A | 7/1998 | Loder et al. |
| 5,793,101 A | 8/1998 | Kuhn |
| 6,005,778 A * | 12/1999 | Spielberger et al. ........ 361/770 |
| 6,037,661 A | 3/2000 | Palagonia et al. |
| 6,072,243 A | 6/2000 | Nakanishi |
| 6,114,752 A * | 9/2000 | Huang et al. ................ 257/666 |
| 6,133,637 A | 10/2000 | Hikita et al. |
| 6,140,154 A | 10/2000 | Hinkle et al. |
| 6,175,149 B1 | 1/2001 | Akram |
| 6,197,615 B1 | 3/2001 | Song et al. |
| 6,265,760 B1 | 7/2001 | Inaba et al. |
| 6,297,547 B1 | 10/2001 | Akram |
| 6,303,981 B1 | 10/2001 | Moden |
| 6,313,527 B1 | 11/2001 | Han et al. |
| 6,333,549 B2 | 12/2001 | Drehobl et al. |

(Continued)

FOREIGN PATENT DOCUMENTS

JP 0316550 A2 7/1991

(Continued)

*Primary Examiner*—Lex Malsawma
*Assistant Examiner*—Khiem D Nguyen
(74) *Attorney, Agent, or Firm*—TraskBritt

(57) ABSTRACT

A semiconductor die assembly includes a substantially planar lead frame including a die paddle and a plurality of lead fingers, a first semiconductor die secured by an active surface thereof to the die paddle, a second semiconductor die secured by a backside thereof to the die paddle, wire bonds extending from the first semiconductor die and the second semiconductor die to lead fingers of the plurality, and an encapsulant extending over the first semiconductor die, the second semiconductor die, the die paddle, the wire bonds and portions of the lead fingers. A method of fabricating the semiconductor die assembly and an electronic system incorporating the semiconductor die assembly are also disclosed.

34 Claims, 3 Drawing Sheets

U.S. PATENT DOCUMENTS

| | | |
|---|---|---|
| 6,337,521 B1 | 1/2002 | Masuda |
| 6,437,447 B1 | 8/2002 | Huang et al. |
| 6,476,474 B1 | 11/2002 | Hung |
| 6,479,323 B1 | 11/2002 | Lo et al. |
| 6,483,181 B2 | 11/2002 | Chang et al. |
| 6,528,408 B2 | 3/2003 | Kinsman |
| 6,552,416 B1 | 4/2003 | Foster |
| 6,555,902 B2 | 4/2003 | Lo et al. |
| 6,680,531 B2 | 1/2004 | Hsu et al. |
| 6,692,991 B2 | 2/2004 | Minamio et al. |
| 6,700,206 B2 | 3/2004 | Kinsman |
| 6,951,982 B2 | 10/2005 | Chye et al. |
| 7,023,076 B2 * | 4/2006 | Khiang ................... 257/678 |
| 7,224,070 B2 * | 5/2007 | Yang ...................... 257/777 |
| 2004/0251557 A1 | 12/2004 | Kee |
| 2005/0026325 A1 | 2/2005 | Koon et al. |
| 2005/0121802 A1 * | 6/2005 | Kawano et al. ........... 257/777 |
| 2006/0255436 A1 | 11/2006 | Ozawa |
| 2007/0025684 A1 | 2/2007 | Otremba |
| 2007/0194463 A1 * | 8/2007 | Kim et al. ............... 257/787 |

FOREIGN PATENT DOCUMENTS

JP   2001332684 A2   11/2001

* cited by examiner

TWO DIE SEMICONDUCTOR ASSEMBLY AND SYSTEM INCLUDING SAME

CROSS-REFERENCE TO RELATED APPLICATION

This application is a divisional of application Ser. No. 10/652,163, filed Aug. 29, 2003, pending.

BACKGROUND OF THE INVENTION

1. Field of the Invention

The present invention relates to semiconductor devices and, more particularly, to a thin, two die semiconductor package and method of fabrication thereof.

2. State of the Art

Semiconductor dice are usually packaged to provide a protective structure therefor and to facilitate mechanical and electrical connection thereof to a higher-level assembly, such as a carrier substrate in the form of, for example, a module board or a motherboard. A conventional approach to packaging one or more semiconductor dice is to secure the die or dice to a metal lead frame, wire bond the die bond pads to lead fingers of the lead frame, and encapsulate the resulting assembly with a transfer-molded, silicon-filled thermoplastic polymer with lead fingers of the lead frame extending to the exterior of the molded package. A wide variety of such packages have been developed over the years.

One significant consideration in encapsulation of die assemblies has always been the reliability of the encapsulated assembly. Voids in the encapsulant volume may lead to environmental contamination and failure of the package, or even rupture thereof under high temperature service. Mismatches in the coefficient of thermal expansion (CTE) between the die, the metal lead frame and the encapsulant contribute to internal stresses which can jeopardize package integrity. Further, substantial mismatches in the volume of encapsulant on opposing sides of a lead frame lead to unbalanced stresses within the package as the encapsulant cools to a solid state after molding, resulting in a tendency of the package to "bow" to one side under bending stress and enhancing the potential for stress cracking as well as delamination of the encapsulant from lead fingers extending therethrough.

The potential for the above-noted problems may be aggravated when multiple semiconductor dice are packaged together. For example, when two semiconductor dice are to be packaged in a transfer molded casing, placing both dice on the same side of a lead frame die paddle may, again, exacerbate stresses within the package, due to the unbalanced masses of encapsulant as well as CTE mismatch among the package components.

One conventional approach to avoid this problem is to back-bond each of the two semiconductor dice to the lead frame paddle to provide symmetry on both sides of the lead frame. However, this requires inverting the lead frame paddle for mounting and wire bonding of the second die. Another approach to packaging multiple dice involves the use of a downset lead frame die paddle to facilitate central placement of stacked dice facing in the same direction (active surface up) for ease of wire bonding within the package, but this requires an additional step in deforming the lead frame and the use of differently sized dice to provide access to the bond pads of each die. Yet another packaging approach includes placing two semiconductor dice facing in the same direction (active surface up) on opposing sides of a lead frame, the lower die having a central row of bond pads and the upper die having peripheral bond pads. However, this requires the use of a standoff element under the upper die to provide adequate clearance for the wire bond loops connecting the lower die to the lead frame, thus demanding the use of two differently configured dice and an extra assembly step to place the standoff element, and results in an undesirably thick package.

It would be desirable to provide a lead frame-based, transfer molded package configuration for two semiconductor dice which may incorporate two identically sized dice having the same or similar bond pad arrangements thereon, wherein wire bonding may be effected without inversion of the assembly, and which results in a thin, substantially symmetrical package.

BRIEF SUMMARY OF THE INVENTION

The present invention, in several exemplary embodiments, provides an apparatus and method which address the aforementioned deficiencies in the state of the art and offers a simple and robust packaging approach.

One exemplary embodiment comprises a semiconductor die assembly including a lead frame including a die paddle and a plurality of lead fingers, a first semiconductor die secured by an active surface thereof to the die paddle, a second semiconductor die secured by a backside thereof to the die paddle and wire bonds extending from the first semiconductor die and the second semiconductor die to lead fingers of the plurality. An encapsulant may extend over the first semiconductor die, the second semiconductor die, the die paddle, the wire bonds and portions of the lead fingers.

Another exemplary embodiment comprises a method of fabrication of a semiconductor die assembly, comprising providing a lead frame including a die paddle and a plurality of lead fingers, securing a first semiconductor die by an active surface thereof to the die paddle, forming wire bonds between bond pads of the first semiconductor die and lead fingers of the plurality, securing a second semiconductor die by the backside thereof to the die paddle and forming wire bonds between bond pads of the second semiconductor die and lead fingers of the plurality. An encapsulant may be molded over the first semiconductor die, the second semiconductor die, the die paddle, the wire bonds and portions of the lead fingers.

The apparatus of the present invention may comprise, for example, a thin, small outline package (TSOP) which may be adapted for conventional mounting or as a vertical surface mount package (VSMP) to higher-level packaging. Alternatively, the apparatus of the present invention may be configured as, for example, a quad flat pack (QFP).

The present invention also encompasses an electronic system including at least one semiconductor die assembly according to the present invention.

DETAILED DESCRIPTION OF THE INVENTION

Figure 1:
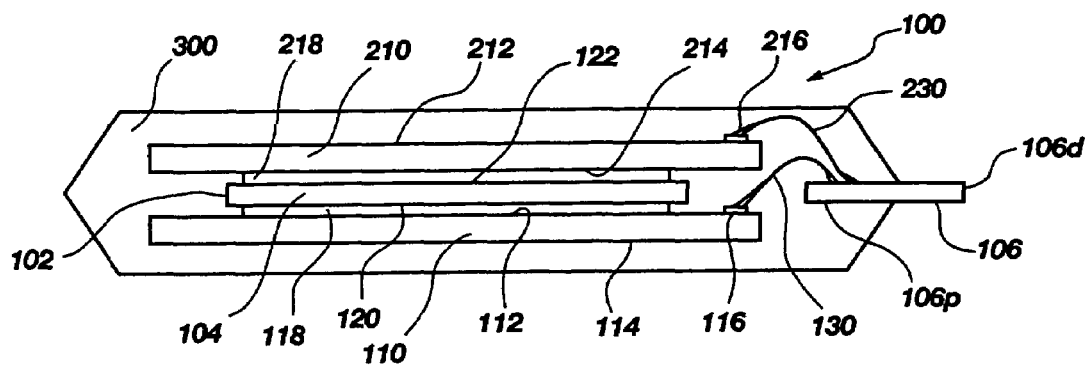
FIG. 1 comprises a side sectional elevation of an exemplary semiconductor die assembly according to the present invention.
Figure 2:
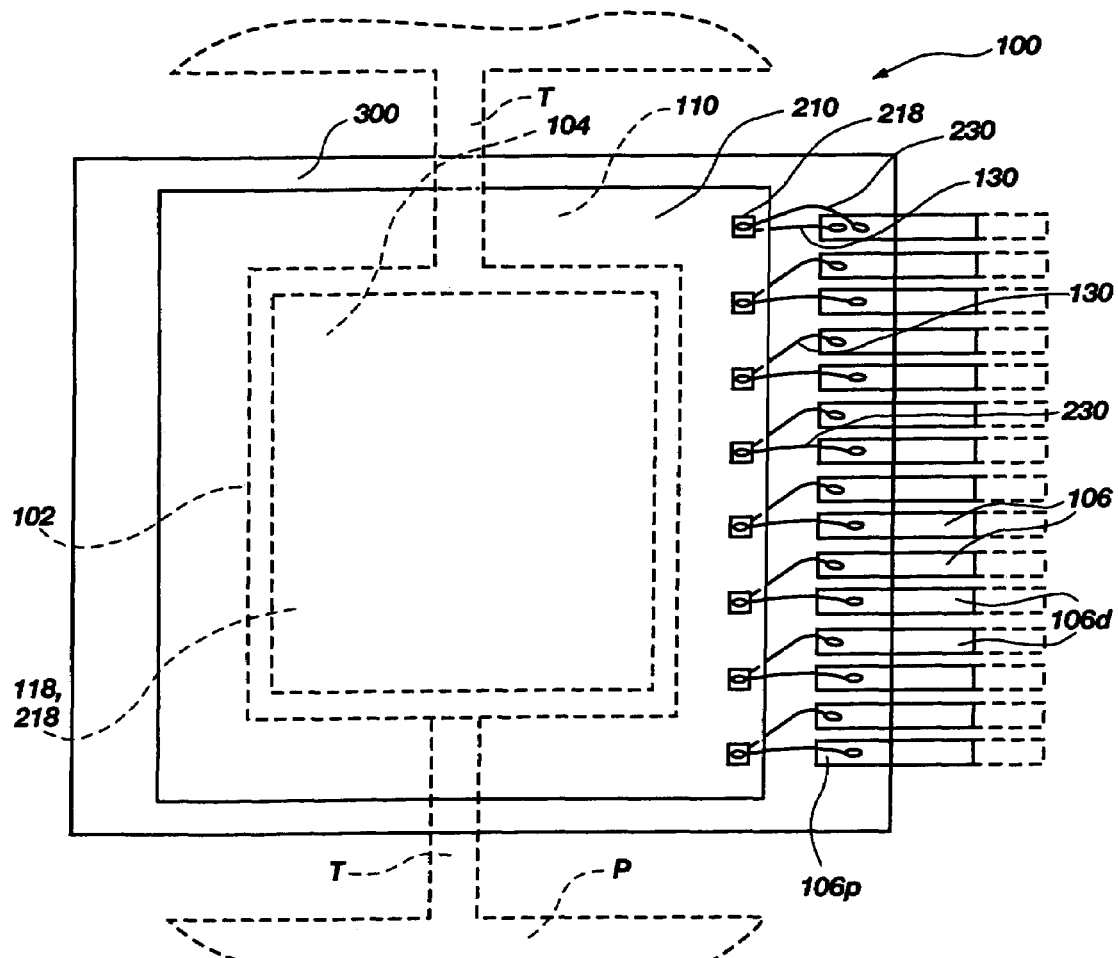
FIG. 2 comprises a top elevation of the exemplary semiconductor die assembly of FIG. 1.

Referring now to FIGS. 1 and 2 of the drawings, exemplary semiconductor die assembly 100 configured as a TSOP includes a substantially planar lead frame 102 including a die paddle 104 and a plurality of lead fingers 106 laterally spaced from die paddle 104 and to one side thereof. As illustrated in FIG. 2, lead fingers 106 may be disposed in a mutually parallel relationship and substantially perpendicular to the proximal side of die paddle 104, but this is not a requirement of the present invention. Lead frame 102 may comprise a stamped or etched metal (for example, copper) lead frame, formed as part of a strip including a plurality of identical lead frames by techniques well known to those of ordinary skill in the art. As illustrated in FIG. 2 in broken lines, both die paddle 104 and lead fingers 106 are initially secured to a peripheral frame element P of the lead frame strip from which the semiconductor die assembly 100 is severed in a so-called trim and form operation, wherein tabs T are severed along the package periphery and the lead fingers 106 are severed at their distal ends 106d and, optionally, deformed into a configuration for attachment to higher-level packaging.

First semiconductor die 110 having an active surface 112, a backside 114 and a row of peripheral bond pads 116 extending along one side thereof is secured by its active surface 112 using a dielectric die attach element 118 to an underside 120 of die paddle 104. As depicted, first semiconductor die 110 may be of greater lateral extent than die paddle 104 and extend therebeyond on all sides. However, it is primarily significant that first semiconductor die 110 extend laterally beyond die paddle 104 adjacent lead fingers 106 for access by a wire bond capillary to bond pads 116. Bond pads 116 may be provided in a row along one side of active surface 112 as part of the initial design of first semiconductor die 110, or may be conventionally rerouted to that location from, for example, an initial central row arrangement using conductive traces formed as part of a so-called redistribution layer.

Die attach element 118 may comprise, for example, an adhesive in the form of, for example, a thermoset or thermoplastic resin applied to die paddle 104 in liquid or other flowable form. However, it is currently preferred that die attach element 118 comprise a segment of dielectric film such as a polyimide, which is commercially offered, among others, as KAPTON® brand film, coated on each side thereof with a pressure-sensitive adhesive.

Second semiconductor die 210, which may be substantially identical in size, shape and bond pad configuration to first semiconductor die 110 and having an active surface 212, a backside 214 and a row of peripheral bond pads 216 extending along one side thereof is secured by its backside 214 using a dielectric die attach element 218 to a top side 122 of die paddle 104. As depicted, second semiconductor die 210 may be of greater lateral extent than die paddle 104 and extend therebeyond on all sides. However, this is not a requirement of the present invention. Die attach element 218 may be, for convenience, identical in size, shape and material or materials to die attach element 118.

A plurality of wire bonds 130 extends between bond pads 116 of first semiconductor die 110 and lead fingers 106 of the plurality. Likewise, a plurality of wire bonds 230 extends between bond pads 216 of second semiconductor die 210 and lead fingers 106 of the plurality. As depicted in FIG. 2, one or more wire bonds 130 and one or more wire bonds 230 may extend to a common lead finger 106 to provide, for example, power or ground or another bias voltage to both first semiconductor die 110 and second semiconductor die 210. Wire bonds may be formed using conventional techniques and may comprise, for example, gold, aluminum or alloys thereof. It is currently preferred to use standoff stitch bonding to form wire bonds 130 and conventional low loop bonding to form wire bonds 230, although the invention is not so limited.

Encapsulant body 300 is formed over die paddle 104, first semiconductor die 110, second semiconductor die 210, wire bonds 130 and 230, and proximal ends 106p of lead fingers 106, distal ends 106d extending beyond encapsulant body 300 to provide mechanical and electrical coupling for semiconductor die assembly 100 to higher-level packaging. Encapsulant body 300 may be formed by any suitable technique known in the art, including injection molding and pot molding. However, it is currently preferred that encapsulant body 300 be formed by transfer molding, wherein a thermoplastic, silicon particle-filled resin is heated to a molten state and transferred under pressure through a runner or passage in a mold assembly to a cavity holding semiconductor die assembly 100.

Fabrication of semiconductor die assembly 100 may be effected by securing first semiconductor die 110 by active surface 112 using die attach element 118 to the underside 120 of die paddle 104 at a location wherein bond pads 116 are exposed beyond the edge of die paddle 104 proximate lead fingers 106 so that adequate clearance is provided for a wire bond capillary. Wire bonds 130 are then selectively formed between bond pads 116 and lead fingers 106.

Second semiconductor die 210 is then secured by its backside 214 to top side 122 of die paddle 104 using die attach element 218. As shown, second semiconductor die 210 may be superimposed over first semiconductor die 110 so that the lateral periphery of each die is coextensive with that of the other, and first and second semiconductor dice 110, 210 are symmetrically disposed with respect to die paddle 104. Such disposition is not a requirement of the present invention but provides the most compact package and conserves space, or "real estate," on a carrier substrate, such as a circuit board, if semiconductor die assembly 100 is to be conventionally mounted parallel to the plane of the substrate. Wire bonds 230 are then selectively formed between bond pads 216 and lead fingers 106.

The resulting semiconductor die assembly 100 may then be placed in a mold cavity of a transfer molding assembly and encapsulant body 300 formed over die paddle 104, first semiconductor die 110, second semiconductor die 210, wire bonds 130 and 230, and proximal ends 106p of lead fingers 106, with distal ends 106d extending therebeyond. A trim and form operation may then be conducted, as previously noted, to sever semiconductor die assembly 100 from peripheral frame element P and form distal ends 106d of lead fingers 106 to a desired configuration.

Figure 3:
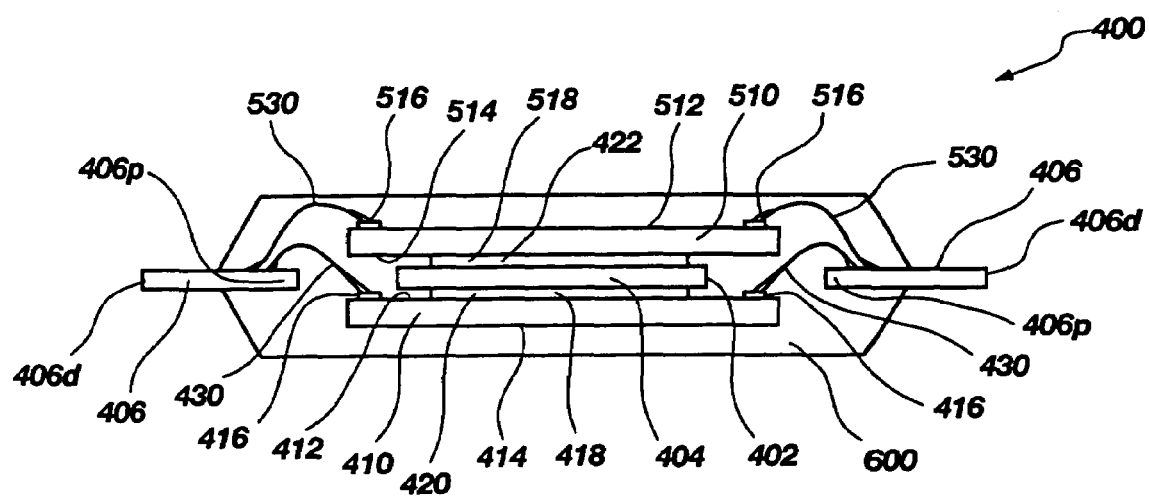
FIG. 3 comprises a side sectional elevation of another exemplary semiconductor die assembly according to the present invention.
Figure 4:
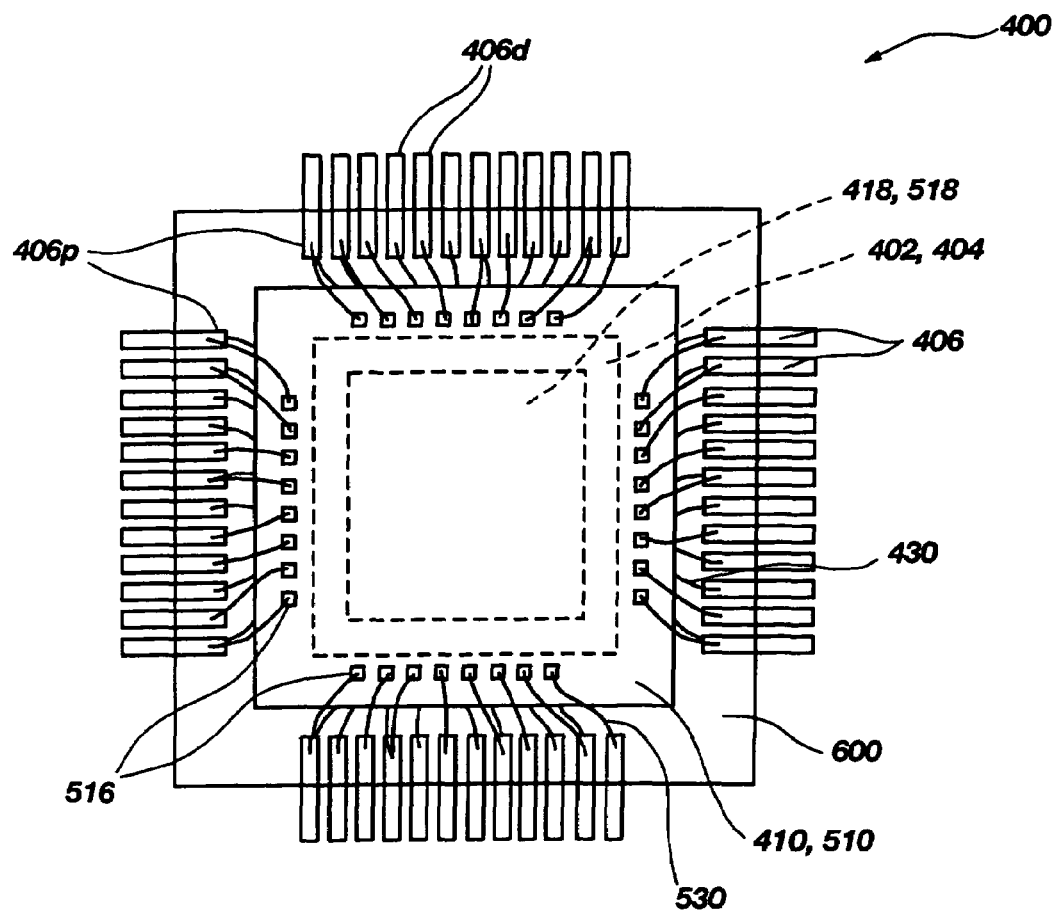
FIG. 4 comprises a top elevation of the exemplary semiconductor die assembly of FIG. 3.

Referring now to FIGS. 3 and 4 of the drawings, another exemplary semiconductor die assembly 400 configured as a QFP includes a substantially planar lead frame 402 including a die paddle 404 and a plurality of lead fingers 406 laterally spaced from die paddle 404 and comprising a plurality of groups of lead fingers 406, each group adjacent a side thereof. As illustrated in FIG. 4, lead fingers 406 may be disposed in a mutually parallel relationship and substantially perpendicular to the proximal side of die paddle 404, but this is not a requirement of the present invention. Lead frame 402 may comprise a stamped or etched metal (for example, copper) lead frame, formed as part of a strip including a plurality of identical lead frames by techniques well known to those of ordinary skill in the art. As in the case of the first embodiment, both die paddle 404 and lead fingers 406 are initially secured to a peripheral frame element of the lead frame strip from which the semiconductor die assembly 400 is severed in a so-called trim and form operation and the lead fingers 406 are severed at their distal ends 406d and, optionally, deformed into a configuration for attachment to higher-level packaging.

First semiconductor die 410 having an active surface 412, a backside 414 and a plurality of peripheral bond pads 416 in a plurality of groups, each group of bond pads 416 extending along one side of active surface 412, is secured by its active surface 412 using a dielectric die attach element 418 to an underside 420 of die paddle 404. As depicted, first semiconductor die 410 may be of greater lateral extent than die paddle 404 and extend therebeyond on all sides for access by a wire bond capillary to bond pads 416. Bond pads 416 may be provided in a row along each side of active surface 412 as part of the initial design of first semiconductor die 410, or may be conventionally rerouted to that location from, for example, an initial central row arrangement using conductive traces formed as part of a so-called redistribution layer. Die attach element 418 may comprise the same material or materials as die attach elements 118 and 218 (see FIG. 2).

Second semiconductor die 510, which may be substantially identical in size, shape and bond pad configuration to first semiconductor die 410 and having an active surface 512, a backside 514 and a row of peripheral bond pads 516 in a plurality of groups, each group of bond pads 516 extending along one side of active surface 512, is secured by its backside 514 using a dielectric die attach element 518 to a top side 422 of die paddle 404. As depicted, second semiconductor die 510 may be of greater lateral extent than die paddle 404 and extend therebeyond on all sides. Die attach element 518 may be, for convenience, identical in size, shape and material or materials to die attach element 418.

A plurality of wire bonds 430 extends between bond pads 416 of first semiconductor die 410 and lead fingers 406 of the plurality. Likewise, a plurality of wire bonds 530 extends between bond pads 516 of second semiconductor die 510 and lead fingers 406 of the plurality. As depicted in FIG. 4, one or more wire bonds 430 and one or more wire bonds 530 may extend to a common lead finger 406 to provide, for example, power or ground or another bias voltage to both first semiconductor die 410 and second semiconductor die 510. Wire bonds may be formed using conventional techniques and may comprise, for example, gold, aluminum or alloys thereof.

Encapsulant body 600 is formed over die paddle 404, first semiconductor die 410, second semiconductor die 510, the plurality of wire bonds 430 and 530, and proximal ends 406p of lead fingers 406, with distal ends 406d extending beyond encapsulant body 600 to provide mechanical and electrical coupling for semiconductor die assembly 400 to higher-level packaging. Encapsulant body 600 may be formed, as in the case of the first embodiment, by transfer molding.

Fabrication of semiconductor die assembly 400 may be effected by securing active surface 412 of first semiconductor die 410 by using die attach element 418 to the underside 420 of die paddle 404 in a symmetrical, superimposed arrangement, wherein bond pads 416 are exposed beyond the edges of die paddle 404 proximate lead fingers 406 so that adequate clearance is provided on all sides of die paddle 404 for a wire bond capillary. Wire bonds 430 are then selectively formed between bond pads 416 and lead fingers 406.

Second semiconductor die 510 is then secured by its backside 514 to top side 422 of die paddle 404 using die attach element 518. As shown, second semiconductor die 510 may be superimposed over first semiconductor die 410 so that the lateral periphery of each die is coextensive with that of the other, and first and second semiconductor dice 410, 510 are symmetrically disposed with respect to die paddle 404. Such disposition is not a requirement of the present invention but provides the most compact package and conserves space, or "real estate," on a carrier substrate, such as a circuit board, if semiconductor die assembly 400 is to be conventionally mounted parallel to the plane of the substrate. Wire bonds 530 are then selectively formed between bond pads 516 and lead fingers 406.

The resulting assembly may then be placed in a mold cavity of a transfer molding assembly and encapsulant body 600 formed over die paddle 404, first semiconductor die 410, second semiconductor die 510, wire bonds 430 and 530, and proximal ends 406p of lead fingers 406, with distal ends 406d extending therebeyond. A trim and form operation may then be conducted, as previously noted, to sever semiconductor die assembly 400 from the peripheral frame element of the lead frame strip and form distal ends 406d of lead fingers 406 to a desired configuration.

Figure 5:
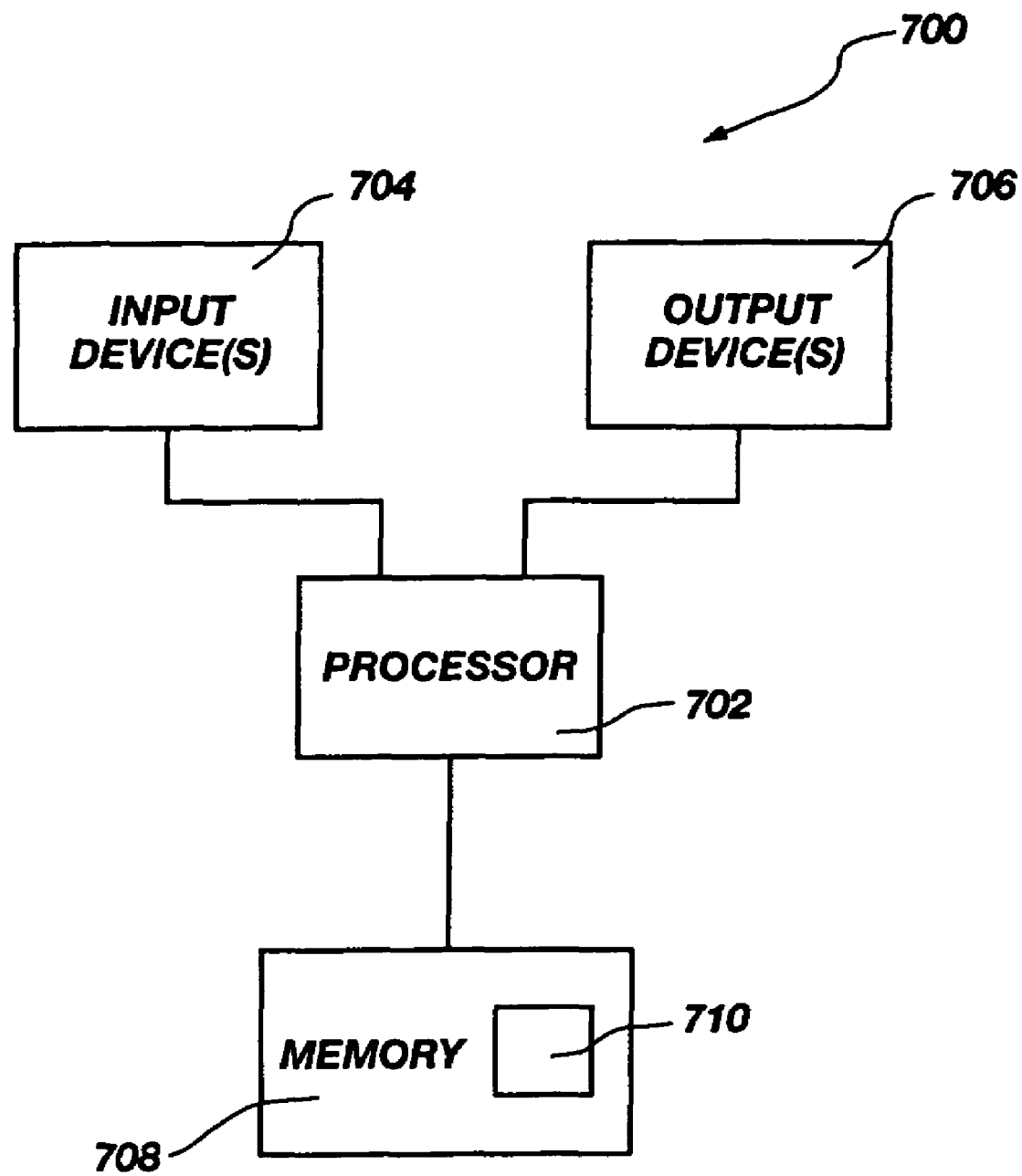
FIG. 5 comprises a schematic of an electronic system incorporating at least one semiconductor die assembly according to the present invention.

FIG. 5 is a schematic of an exemplary electronic system 700, which may be configured, for example, as a personal computer and which incorporates at least one semiconductor die assembly according to the present invention. Electronic system 700 includes a processor 702 which is operably coupled to one or more input devices 704 such as, for example, a keyboard and a mouse. Processor 702 is also operably coupled to one or more output devices 706 such as, for example, a display and a printer. Finally, processor 702 is also operably coupled to memory 708, which may comprise a hard drive and which further incorporates memory in the form of dynamic random access memory (DRAM) comprising semiconductor dice in an assembly 710 according to the present invention. Assembly 710 may comprise exemplary semiconductor die assembly 100, exemplary semiconductor die assembly 400, or any other semiconductor die assembly according to the present invention. Assembly 710 may further comprise a memory module including a plurality of semiconductor die assemblies according to the present invention.

While the present invention has been described in the context of several exemplary embodiments, those of ordinary skill in the art will understand and appreciate that it is not so limited. Additions, deletions and modifications to the exemplary embodiments may be effected without departing from the scope of the present invention, which is defined by the claims which follow herein and their equivalents.

What is claimed is:

1. A semiconductor die assembly, comprising:
   a lead frame including a die paddle and a plurality of lead fingers laterally adjacent only a single peripheral edge of the die paddle;
   a first semiconductor die including an active surface having a first plurality of bond pads disposed adjacent a periphery thereof and a backside, the first semiconductor die being secured by the active surface thereof to one side of the die paddle with the first plurality of bond pads adjacent to the plurality of lead fingers;

a second semiconductor die including an active surface having a second plurality of bond pads disposed adjacent a periphery thereof and a backside, the second semiconductor die being secured by the backside thereof to another side of the die paddle with the second plurality of bond pads adjacent to the plurality of lead fingers;

a first plurality of wire bonds selectively extending between bond pads of the first plurality of the first semiconductor die and portions of lead fingers of the plurality proximal to the die paddle; and a second plurality of wire bonds selectively extending between bond pads of the second plurality of the second semiconductor die and portions of lead fingers of the plurality proximal to the die paddle.

2. The semiconductor die assembly of claim 1, further including an encapsulant body extending over the die paddle, the first semiconductor die, the second semiconductor die, the first plurality of wire bonds, the second plurality of wire bonds and the proximal portions of the lead fingers, wherein portions of the lead fingers distal from the die paddle extend beyond the encapsulant body.

3. The semiconductor die assembly of claim 1, wherein the first and second semiconductor dice are of substantially identical size, shape and bond pad configuration.

4. The semiconductor die assembly of claim 3, wherein the first and second semiconductor dice are disposed in mutual superimposition.

5. The semiconductor die assembly of claim 4, wherein the first and second semiconductor dice are of greater lateral extent than the die paddle.

6. The semiconductor die assembly of claim 5, wherein the first and second semiconductor dice extend beyond a lateral periphery of the die paddle on all sides thereof.

7. The semiconductor die assembly of claim 3, wherein the first and second semiconductor dice extend beyond a lateral periphery of the die paddle adjacent the plurality of lead fingers.

8. The semiconductor die assembly of claim 7, wherein the first and second semiconductor dice extend beyond the lateral periphery of the die paddle a substantially equal distance.

9. The semiconductor die assembly of claim 1, wherein at least one of the first plurality of wire bonds and at least one of the second plurality of wire bonds of the second plurality extend to a common lead finger.

10. The semiconductor die assembly of claim 1, wherein the first plurality of bond pads is disposed adjacent only a single edge of the active surface of the first semiconductor die and the second plurality of bond pads is disposed adjacent only a single edge of the active surface of the second semiconductor die.

11. The semiconductor die assembly of claim 1, wherein the first semiconductor die is secured to the one side of the die paddle using a first die attach element and the second semiconductor die is secured to the another side of the die paddle using a second die attach element.

12. The semiconductor die assembly of claim 11, wherein the first and second die attach elements comprise a dielectric material.

13. The semiconductor die assembly of claim 1, wherein the first and second semiconductor dice are disposed in mutual superimposition.

14. The semiconductor die assembly of claim 1, wherein the first and second semiconductor dice are of greater lateral extent than the die paddle.

15. The semiconductor die assembly of claim 14, wherein the first and second semiconductor dice extend beyond a lateral periphery of the die paddle on all sides thereof.

16. The semiconductor die assembly of claim 1, wherein the first and second semiconductor dice extend beyond a lateral periphery of the die paddle adjacent the plurality of lead fingers.

17. The semiconductor die assembly of claim 16, wherein the first and second semiconductor dice extend beyond the lateral periphery of the die paddle a substantially equal distance.

18. An electronic system, comprising:

a processor;

at least one input device operably coupled to the processor;

at least one output device operably coupled to the processor;

memory operably coupled to the processor, the memory including at least one semiconductor die assembly, comprising:

a lead frame including a die paddle and a plurality of lead fingers laterally adjacent only a single peripheral edge of the die paddle;

a first semiconductor die including an active surface having a first plurality of bond pads disposed adjacent a periphery thereof and a backside, the first semiconductor die being secured by the active surface thereof to one side of the die paddle with the first plurality of bond pads adjacent to the plurality of lead fingers;

a second semiconductor die including an active surface having a second plurality of bond pads disposed adjacent a periphery thereof and a backside, the second semiconductor die being secured by the backside thereof to another side of the die paddle with the second plurality of bond pads adjacent to the plurality of lead fingers;

a first plurality of wire bonds selectively extending between bond pads of the first plurality of the first semiconductor die and portions of lead fingers of the plurality proximal to the die paddle; and a second plurality of wire bonds selectively extending between bond pads of the second plurality of the second semiconductor die and portions of lead fingers of the plurality proximal to the die paddle.

19. The electronic system of claim 18, further including an encapsulant body extending over the die paddle, the first semiconductor die, the second semiconductor die, the first plurality of wire bonds, the second plurality of wire bonds and the proximal portions of the lead fingers, wherein portions of the lead fingers distal from the die paddle extend beyond the encapsulant body.

20. The electronic system of claim 18, wherein the first and second semiconductor dice are of substantially identical size, shape and bond pad configuration.

21. The electronic system of claim 20, wherein the first and second semiconductor dice are disposed in mutual superimposition.

22. The electronic system of claim 21, wherein the first and second semiconductor dice are of greater lateral extent than the die paddle.

23. The electronic system of claim 22, wherein the first and second semiconductor dice extend beyond a lateral periphery of the die paddle on all sides thereof.

24. The electronic system of claim 20, wherein the first and second semiconductor dice extend beyond a lateral periphery of the die paddle adjacent the plurality of lead fingers.

25. The electronic system of claim 24, wherein the first and second semiconductor dice extend beyond the lateral periphery of the die paddle a substantially equal distance.

26. The electronic system of claim 18, wherein at least one of the first plurality of wire bonds and at least one of the second plurality of wire bonds extend to a common lead finger.

27. The electronic system of claim 18, wherein the first plurality of bond pads is disposed adjacent only a single edge of the active surface of the first semiconductor die and the second plurality of bond pads is disposed adjacent only a single edge of the active surface of the second semiconductor die.

28. The electronic system of claim 18, wherein the first semiconductor die is secured to one side of the die paddle using a first die attach element and the second semiconductor die is secured to the another side of the die paddle using a second die attach element.

29. The electronic system of claim 28, wherein the first and second die attach elements comprise a dielectric material.

30. The electronic system of claim 18, wherein the first and second semiconductor dice are disposed in mutual superimposition.

31. The electronic system of claim 18, wherein the first and second semiconductor dice are of greater lateral extent than the die paddle.

32. The electronic system of claim 31, wherein the first and second semiconductor dice extend beyond a lateral periphery of the die paddle on all sides thereof.

33. The electronic system of claim 18, wherein the first and second semiconductor dice extend beyond a lateral periphery of the die paddle adjacent the plurality of lead fingers.

34. The electronic system of claim 33, wherein the first and second semiconductor dice extend beyond the lateral periphery of the die paddle a substantially equal distance.

* * * * *